United States Patent
Akiyama

(10) Patent No.: US 11,081,452 B2
(45) Date of Patent: Aug. 3, 2021

(54) FIELD EFFECT TRANSISTOR AND SEMICONDUCTOR DEVICE

(71) Applicant: SUMITOMO ELECTRIC DEVICE INNOVATIONS, INC., Kanagawa (JP)

(72) Inventor: Chihoko Akiyama, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/801,477

(22) Filed: Feb. 26, 2020

(65) Prior Publication Data

US 2020/0279818 A1    Sep. 3, 2020

(30) Foreign Application Priority Data

Feb. 28, 2019 (JP) .............................. JP2019-035726

(51) Int. Cl.
*H01L 23/58* (2006.01)
*H01L 29/06* (2006.01)
(Continued)

(52) U.S. Cl.
CPC .......... *H01L 23/585* (2013.01); *H01L 23/492* (2013.01); *H01L 23/564* (2013.01); *H01L 24/05* (2013.01); *H01L 24/32* (2013.01); *H01L 24/48* (2013.01); *H01L 24/73* (2013.01); *H01L 29/0684* (2013.01); *H01L 21/0217* (2013.01); *H01L 21/0254* (2013.01); *H01L 21/0272* (2013.01); *H01L 21/0277* (2013.01); (Continued)

(58) Field of Classification Search
CPC ..... H01L 23/585; H01L 23/492; H01L 24/05; H01L 24/32; H01L 24/48; H01L 24/73; H01L 29/0684; H01L 2224/04042; H01L 2224/29139; H01L 2224/29144; H01L 2224/29147; H01L 2224/32245; H01L 2224/73265
See application file for complete search history.

(56) References Cited

U.S. PATENT DOCUMENTS 10,903,323 B2 * 1/2021 Akiyama .......... H01L 29/41758
2005/0239259 A1 * 10/2005 Bickel .................. H01L 23/481
                                                                438/350
(Continued)

FOREIGN PATENT DOCUMENTS

JP       2010-177550       8/2010

*Primary Examiner* — Douglas W Owens
(74) *Attorney, Agent, or Firm* — Smith, Gambrell & Russell, LLP.

(57) ABSTRACT

A field effect transistor includes: a semiconductor region including a first inactive region, an active region, and a second inactive region arranged side by side in a first direction; a gate electrode, a source electrode, and a drain electrode on the active region; a gate pad on the first inactive region; a gate guard on and in contact with the semiconductor region, the gate guard being apart from the gate pad and located between an edge on the first inactive region side of the semiconductor region and the gate pad; a drain pad on the second inactive region; a drain guard on and in contact with the semiconductor region, the drain guard being apart from the drain pad and located between an edge on the second inactive region side of the semiconductor region and the drain pad; and a metal film electrically connected to the gate guard.

14 Claims, 11 Drawing Sheets

(51) Int. Cl.
   H01L 29/40       (2006.01)
   H01L 23/00       (2006.01)
   H01L 23/492      (2006.01)
   H01L 29/20           (2006.01)
   H01L 29/778          (2006.01)
   H01L 29/45           (2006.01)
   H01L 29/423          (2006.01)
   H01L 29/47           (2006.01)
   H01L 29/66           (2006.01)
   H01L 21/02           (2006.01)
   H01L 21/265          (2006.01)
   H01L 21/311          (2006.01)
   H01L 21/3213         (2006.01)
   H01L 21/027          (2006.01)
   H01L 29/205          (2006.01)

(52) U.S. Cl.
   CPC ... *H01L 21/02211* (2013.01); *H01L 21/02274* (2013.01); *H01L 21/2654* (2013.01); *H01L 21/31144* (2013.01); *H01L 21/32139* (2013.01); *H01L 24/03* (2013.01); *H01L 29/2003* (2013.01); *H01L 29/205* (2013.01); *H01L 29/402* (2013.01); *H01L 29/42316* (2013.01); *H01L 29/452* (2013.01); *H01L 29/475* (2013.01); *H01L 29/66462* (2013.01); *H01L 29/7786* (2013.01); *H01L 2224/0345* (2013.01); *H01L 2224/0346* (2013.01); *H01L 2224/03614* (2013.01); *H01L 2224/04042* (2013.01); *H01L 2224/05582* (2013.01); *H01L 2224/05644* (2013.01); *H01L 2224/05666* (2013.01); *H01L 2224/05684* (2013.01); *H01L 2224/29139* (2013.01); *H01L 2224/29144* (2013.01); *H01L 2224/29147* (2013.01); *H01L 2224/32245* (2013.01); *H01L 2224/73265* (2013.01); *H01L 2924/1033* (2013.01); *H01L 2924/10344* (2013.01); *H01L 2924/13064* (2013.01); *H01L 2924/30111* (2013.01)

(56) References Cited

U.S. PATENT DOCUMENTS

2010/0193894 A1    8/2010   Hishida et al.
2017/0221878 A1*   8/2017   Risaki ................ H01L 23/4824

* cited by examiner

FIELD EFFECT TRANSISTOR AND SEMICONDUCTOR DEVICE

CROSS REFERENCE TO RELATED APPLICATIONS

This application claims the benefit of priority from Japanese Application No. JP2019-035726 filed on Feb. 28, 2019, the entire contents of which are incorporated herein by references.

TECHNICAL FIELD

The present disclosure relates to a field effect transistor and a semiconductor device.

BACKGROUND

Japanese Unexamined Patent Publication No. 2010-177550 describes a technology relating to a semiconductor device. The semiconductor device disclosed in this document includes a semiconductor chip, two electrode pads arranged on the semiconductor chip, and a conductive guard ring arranged between the two electrode pads and the outer periphery on the semiconductor chip. By eliminating a part of the guard ring, the guard ring is divided into a plurality of unit regions insulated from each other.

SUMMARY

There is provided a field effect transistor and a semiconductor device according to one embodiment, including: a substrate including a main surface and a back surface; a semiconductor region on the main surface, the semiconductor region including a first inactive region, an active region, and a second inactive region arranged side by side in a first direction; a gate electrode, a source electrode, and a drain electrode on the active region; a gate pad on the first inactive region and electrically connected to the gate electrode; a gate guard on and in contact with the semiconductor region, the gate guard being apart from the gate pad and located between the gate pad and an edge on the first inactive region side of a pair of edges of the semiconductor region arranged side by side in the first direction; a drain pad on the second inactive region and electrically connected to the drain electrode; a drain guard on and in contact with the semiconductor region, the drain guard being apart from the drain pad and located between the drain pad and an edge on the second inactive region side of the pair of edges of the semiconductor region; and a metal film on the back surface and electrically connected to the gate guard. The drain guard is in a non-conductive state with respect to the metal film, the gate electrode, the source electrode, and the drain electrode.

DETAILED DESCRIPTION

Figure 1:
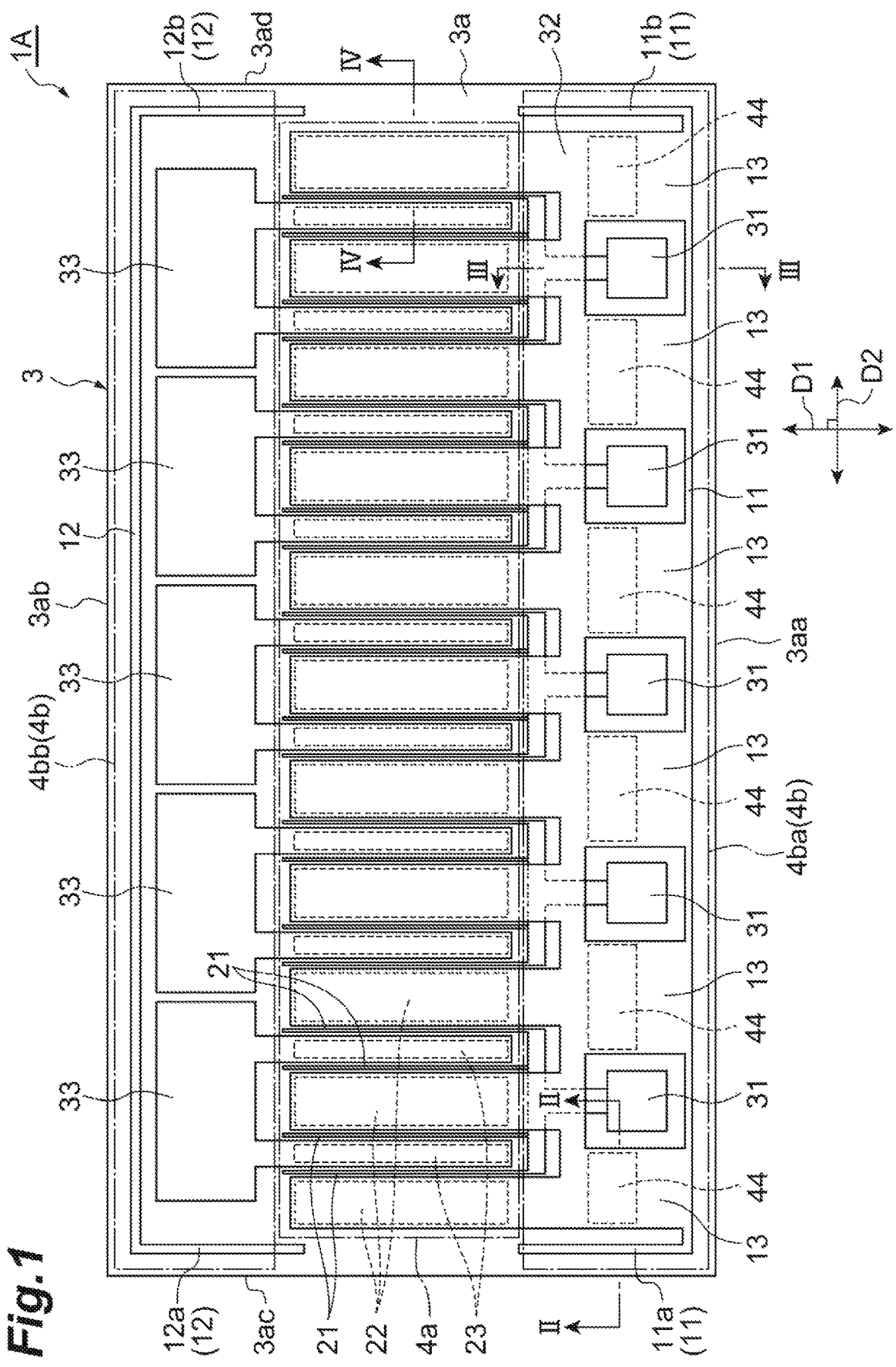
FIG. 1 is a plan view showing a configuration of a field effect transistor (hereinafter, simply referred to as a transistor) according to the first embodiment.

Problem to be Solved by the Present Disclosure

A field effect transistor includes a semiconductor region forming a main surface of a substrate, and a gate electrode, a source electrode, and a drain electrode provided on an active region in the semiconductor region. Wires extend from these electrodes, and the tips of the wires are connected to pads for wire bonding. For example, a gate pad connected to the gate electrode is provided on an inactive region located on one side with respect to the active region. A drain pad connected to the drain electrode is provided on an inactive region located on the other side with respect to the active region. A metal film is provided on the back surface of the substrate, and the back metal film is conductively bonded to a metal base member via a conductive bonding material. In many cases, the base member is defined at a reference potential (ground potential).

The following problems occur in the field effect transistor having the above configuration. In one use example, a negative voltage lower than the reference potential is applied to the gate electrode. Therefore, an electric field with the gate pad side being negative is generated between the gate pad and the base member. In a humid environment, ion migration of a metal (for example, Ag, Au, Cu) contained in the conductive bonding material between the base member and the back metal film is likely to occur due to this electric field. The ion migration is a phenomenon in which ionized metal moves on the surface of a substance in an electric field. The metal ions move by being attracted by the electric field, return to the metal from the ionized state for some reason, and accumulate to form dendrites. If the dendrites of metal grow from the conductive bonding material and the gate pad and the back metal film are short-circuited, the operation of the semiconductor device may be defective. Therefore, the present disclosure has an object to reduce a short circuit between a back metal film and a gate pad due to ion migration of a metal contained in a conductive bonding material, and provide a field effect transistor and a semiconductor device that can improve the moisture resistance of the field effect transistor.

Effect of the Embodiment of the Present Disclosure

According to the present disclosure, it is possible to reduce to a short circuit between the back metal film and the gate pad due to ion migration of a metal contained in the conductive bonding material, and provide the field effect transistor and the semiconductor device that can improve the moisture resistance of the field effect transistor.

DESCRIPTION OF EMBODIMENTS OF THE PRESENT DISCLOSURE

First, the details of the embodiments of the present disclosure will be listed and described. One embodiment of the present disclosure is a field effect transistor, including: a semiconductor region provided on a main surface of a substrate and including a first inactive region, an active region, and a second inactive region arranged side by side in a first direction; a gate electrode, a source electrode, and a drain electrode provided on the active region; a gate pad provided on the first inactive region and electrically connected to the gate electrode; a gate guard made of metal, provided on and in contact with the semiconductor region so as to be apart from the gate pad between the gate pad and an edge on the first inactive region side of a pair of edges of the semiconductor region arranged side by side in the first direction; a drain pad provided on the second inactive region and electrically connected to the drain electrode; and a drain guard made of metal, provided on and in contact with the semiconductor region so as to be apart from the drain pad between the drain pad and an edge on the second inactive region side of the pair of edges of the semiconductor region. The gate guard is electrically connected to a metal film provided on the back surface of the substrate, and the drain guard is in a non-conductive state with respect to the metal film, the gate electrode, the source electrode, and the drain electrode.

The source electrode may be electrically connected to the metal film via a wire penetrating the substrate and the semiconductor region, and the gate guard may be electrically connected to the source electrode.

The field effect transistor further includes a source pad arranged on the first inactive region side by side with the gate pad, and electrically connected to the source electrode, and the gate guard may extend from the source pad along the edge on the first inactive region side.

The field effect transistor may further include an insulating film having openings on the drain pad and the gate pad, and the gate guard and the drain guard may be covered with the insulating film.

Another embodiment of the present disclosure is a semiconductor device, including: the field effect transistor; a base member having a metal surface and mounting the field effect transistor; and a conductive bonding material interposed between a metal film of the field effect transistor and a surface of the base member and containing at least one of Ag, Au, and Cu.

A package housing the field effect transistor may have a non-hermetic structure.

Specific examples of the field effect transistor and the semiconductor device according to the present disclosure will be described below with reference to the drawings. The present disclosure is not limited to these examples, but is indicated by the appended claims, and is intended to include any modifications within the scope and meaning equivalent to the appended claims. In the following description, the same elements will be denoted by the same reference symbols in the description of the drawings, and redundant description is omitted.

First Embodiment

Figure 2:
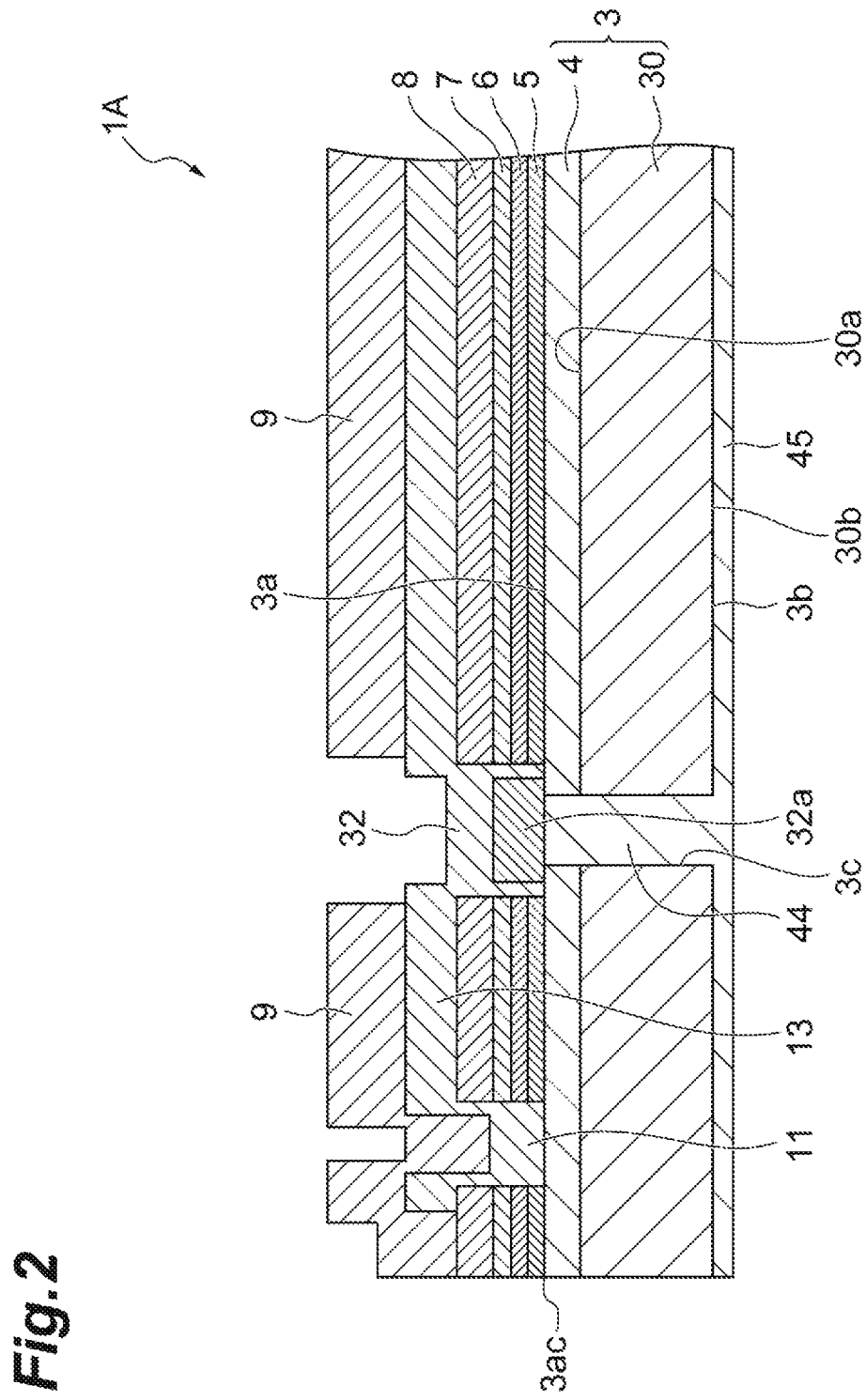
FIG. 2 is a sectional view taken along the line II-II in FIG. 1.
Figure 3:
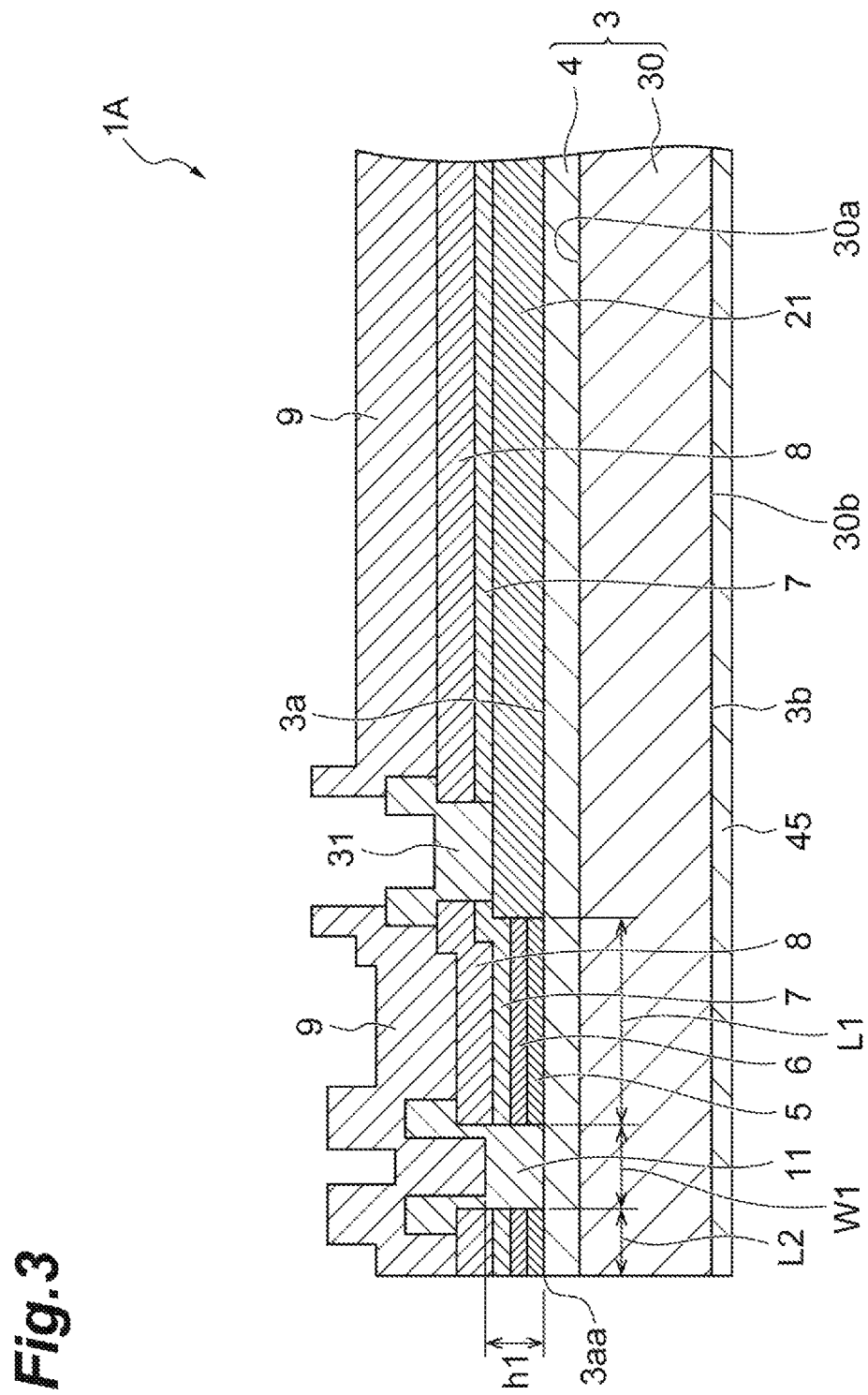
FIG. 3 is a sectional view taken along the line III-III in FIG. 1.
Figure 4:
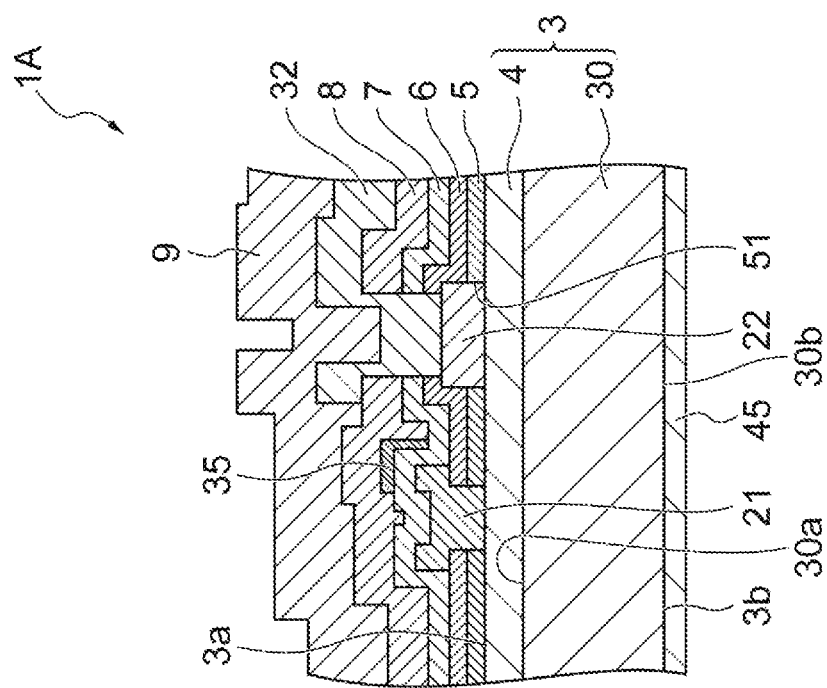
FIG. 4 is a sectional view taken along the line IV-IV in FIG. 1.

FIG. 1 is a plan view showing a configuration of a field effect transistor (hereinafter, simply referred to as a transistor) 1A according to the first embodiment. FIG. 2 is a sectional view taken along the line II-II in FIG. 1. FIG. 3 is a sectional view taken along the line III-III in FIG. 1. FIG. 4 is a sectional view taken along the line IV-IV in FIG. 1. As shown in FIGS. 1 to 4, the transistor 1A includes a substrate 3, insulating films 5 to 9, gate electrodes 21, source electrodes 22, drain electrodes 23, gate pads 31, a source pad 32, drain pads 33, and field plates 35 (see FIG. 4), metal vias 44 (see FIG. 2), and a back metal film 45.

The substrate 3 includes a flat main surface 3a and a flat back surface 3b located on the opposite side of the main surface 3a. The substrate 3 includes a growth substrate 30 and a nitride semiconductor layer 4 provided on a main surface 30a of growth substrate 30. The growth substrate 30 is, for example, a SiC substrate and includes a back surface 30b. The back surface 30b of the growth substrate 30 coincides with the back surface 3b of the substrate 3. The growth substrate 30 is used for epitaxial growth of the nitride semiconductor layer 4.

The nitride semiconductor layer 4 is an example of a semiconductor region in the present embodiment, and is an epitaxial layer formed on the main surface 30a of the growth substrate 30. The nitride semiconductor layer 4 forms the main surface 3a of the substrate 3. When the transistor 1A is a high electron mobility transistor (HEMT), the nitride semiconductor layer 4 includes, for example, an AlN buffer layer in contact with the main surface 30a, a GaN channel layer provided on the AlN buffer layer, an AlGaN (or InAlN) barrier layer provided on the GaN channel layer, and a GaN cap layer provided on the barrier layer. The AlN buffer layer is undoped and has a thickness in the range of, for example, 10 nm to 20 nm. The GaN channel layer is undoped and has a thickness in the range of, for example, 0.4 μm to 1.2 μm. The barrier layer has a thickness in the range of, for example, 10 nm to 30 nm. However, in the case of the InAlN barrier layer, its thickness is set smaller than 20 nm. The GaN cap layer is n-type and has a thickness of, for example, 5 nm.

As shown in FIG. 1, the nitride semiconductor layer 4 includes an active region 4a and an inactive region 4b provided around the active region 4a. The active region 4a is a region that operates as a transistor. The inactive region 4b is a region that is electrically inactivated by implanting ions (protons) such as argon (Ar) into the nitride semiconductor layer 4. The inactive region 4b is provided for electrical isolation between the transistors 1A adjacent to each other and for limiting an operation region of the transistor 1A. The inactive region 4b includes a first inactive region 4ba located on one side in the direction D1 (first direction) along the main surface 3a with respect to the active region 4a, and a second inactive region 4bb located on the other side in the direction D1 with respect to the active region 4a. That is, the first inactive region 4ba, the active region 4a, and the second inactive region 4bb are arranged side by side in this order in the direction D1.

The insulating films 5 to 9 constitute an insulating laminated structure located on the nitride semiconductor layer 4. The insulating films 5 to 9 are provided over substantially the entire surface on the active region 4a and the inactive region 4b. The insulating films 5 to 9 mainly include, for example, silicon compounds such as SiN, $SiO_2$, and SiON. In the present embodiment, the insulating films 5 to 9 are in contact with each other, but another layer may be provided at least one of the portions between the layers.

The plurality of source electrodes 22 are provided on the active region 4a of the nitride semiconductor layer 4, and form an ohmic contact with the active region 4a of the nitride semiconductor layer 4 through an opening 51 (see FIG. 4) formed in the insulating film 5. As shown in FIG. 1, the plurality of source electrodes 22 are arranged side by side along the direction D2 (second direction) intersecting (for example, orthogonal) to the direction D1, and the planar shape of each source electrode 22 is a rectangular shape whose longitudinal direction is the direction D1. The source electrode 22 is formed by alloying a laminated structure including, for example, a Ti layer, an Al layer, and a Ti layer (or a Ta layer, an Al layer, and a Ta layer), and mainly contains Al.

The plurality of drain electrodes 23 are provided on the active region 4a of the nitride semiconductor layer 4, and form an ohmic contact with the active region 4a of the nitride semiconductor layer 4 through an opening formed in the insulating film 5. As shown in FIG. 1, the drain electrodes 23 are alternately arranged with the source electrodes 22 along the direction D2, and the planar shape of each drain electrodes 23 is a rectangular shape whose longitudinal direction is the direction D1. The drain electrode 23 is also formed by alloying a laminated structure including, for example, a Ti layer, an Al layer, and a Ti layer (or a Ta layer, an Al layer, and a Ta layer), and mainly contains Al.

The gate electrode 21 includes a plurality of portions (finger portions) provided on the active region 4a of the nitride semiconductor layer 4, and a portion extending on first inactive region 4ba. The finger portion of each gate electrode 21 extends along the direction D1 and is located between the source electrode 22 and the drain electrode 23. The finger portions of these gate electrodes 21 make Schottky contact with the active region 4a of nitride semiconductor layer 4. The contact width (gate length) between the gate electrode 21 and the nitride semiconductor layer 4 in the direction D2 is, for example, 0.5 μm. The gate electrode 21 has a laminated structure including a Ni layer and an Au layer on the Ni layer. In one example, the Ni layer is in contact with the nitride semiconductor layer 4, and the Au layer is in contact with the Ni layer. Alternatively, a Pd layer may be interposed between the Ni layer and the Au layer.

The field plate 35 is a metal film provided along the gate electrode 21. As shown in FIG. 4, an insulating film 7 is interposed between the field plate 35 and the gate electrode 21. The field plate 35 has, for example, a laminated structure of a Ti layer (or Ta layer) and an Au layer.

The gate pad 31 is a metal film provided on a portion of the gate electrode 21 on the first inactive region 4ba, and is electrically connected to the gate electrode 21 by being in contact with the gate electrode 21 through an opening formed in the insulating films 7 and 8. In the present embodiment, the plurality of gate pads 31 are arranged side by side in the direction D2. Each gate pad 31 is electrically connected to an external wire via a bonding wire. Therefore, the surface of each gate pad 31 is exposed from the opening of the insulating film 9. Each gate pad 31 has a laminated structure including, for example, a TiW layer and an Au layer on the TiW layer.

The source pad 32 is a metal film provided over a part including the active region 4a and the first inactive region 4ba of the nitride semiconductor layer 4. The source pad 32 of the present embodiment includes portions arranged alternately with the gate pads 31 in the direction D2, and portions (finger portions) extending over the source electrodes 22 and covering the source electrodes 22. The source pad 32 is electrically connected to each source electrode 22 by being in contact with each source electrode 22 at the finger portion. The portions of the source pads 32 which are arranged side by side with the gate pads 31 are each exposed from the opening of the insulating film 9, and are each electrically connected to the back metal film 45 through the metal via 44 (see FIG. 2) penetrating the substrate 3. The source pad 32 of the present embodiment includes lower layers 32a (see FIG. 2) in contact with the nitride semiconductor layer 4. The lower layers 32a are used to stop etching when through holes 3c for forming the metal vias 44 are formed in the substrate 3. The lower layer 32a has the same laminated structure as the gate electrode 21, for example. The remaining part of each source pad 32 excluding the lower layer 32a has the same laminated structure as the gate pad 31, for example, a laminated structure including a TiW layer and an Au layer on the TiW layer. This laminated structure is in contact with the nitride semiconductor layer 4 around the lower layer 32a.

The metal via 44 is a wire provided in the through hole 3c penetrating the substrate 3 (the growth substrate 30 and the nitride semiconductor layer 4) from the back surface 3b to the main surface 3a. The metal via 44 reaches the source pad 32 from the back surface 3b of the substrate 3 and is in contact with the source pad 32. The metal vias 44 are provided for electrically connecting the back metal film 45 provided on the back surface 3b and the source electrodes 22 with a low resistance through the source pad 32. When the transistor 1A is mounted on a base member defined at the ground potential (reference potential), the base member and the back metal film 45 are electrically connected to each other via a conductive bonding material such as a sintered-type Ag paste. As a result, the ground potential is applied to the source electrodes 22.

The drain pads 33 are each a metal film provided over a part including the second inactive region 4bb and the active region 4a of the nitride semiconductor layer 4. The drain pad 33 has the same laminated structure as the gate pad 31 and the source pad 32, for example, a laminated structure including a TiW layer and an Au layer on the TiW layer. The drain pad 33 includes portions (finger portions) extending over the drain electrodes 23 and covering the drain electrodes 23 respectively, and is electrically connected to each drain electrode 23 by being in contact with each drain electrode 23. Further, a portion provided on the second inactive region 4bb in the drain pad 33 has, for example, a rectangular shape whose longitudinal direction is the direction D2, and is electrically connected to an external wire via a bonding wire. Therefore, the surface of the portion of the drain pad 33 is exposed from the opening of the insulating film 9.

The transistor 1A of the present embodiment further includes a gate guard 11 and a drain guard 12 provided on the main surface 3a (on the nitride semiconductor layer 4). The gate guard 11 is made of a metal film, fills the openings formed in the insulating films 5 to 8, and is in contact with the first inactive region 4ba of the nitride semiconductor layer 4. The gate guard 11 is provided between an edge 3aa, which is located on the first inactive region 4ba side of a pair of edges 3aa and 3ab (in other words, a pair of edges of the nitride semiconductor layer 4) of the main surface 3a arranged side by side in the direction D1, and the gate pads 31. The gate guard 11 is apart from both the edge 3aa and the gate pads 31. In the illustrated example, the gate guard 11 extends mainly along the direction D2 (along the edge 3aa of the main surface 3a). Further, the gate guard 11 includes a portion 11a extending along a side edge 3ac of the main surface and a portion 11b extending along aside edge 3ad of the main surface 3a. The portions 11a and 11b are arranged side by side in the direction D2. These portions 11a and 11b extend from the vicinity of the edge 3aa, and along the side edges 3ac and 3ad in the direction D1, respectively. The gate guard 11 has such a planar shape, and thus surrounds a pad group including the plurality of gate pads 31 from three sides.

The gate guard 11 is electrically connected to the source pad 32 with a low resistance through wires 13 provided respectively corresponding to the plurality of source pads 32 arranged side by side in the direction D2, and is electrically connected to the source electrodes 22 via the source pad 32. In the present embodiment, the gate guard 11 extends from the source pad 32 along the edge 3aa of the main surface 3a. The gate guard 11 is electrically connected to the back metal film 45 with a low resistance via the wires 13, the source pad 32, and the metal vias 44, and is defined at the same potential (for example, a reference potential) as the source electrodes 22.

Referring to FIG. 3, the contact width W1 between gate guard 11 and main surface 3a in a direction intersecting with the extending direction of the gate guard 11 is, for example, in a range of 1 µm to 10 µm, and is 6 µm in one embodiment. The distance L1 between the gate guard 11 and the gate electrode 21 on the main surface 3a is, for example, in a range of 5 µm to 20 µm, and is 15 µm in one embodiment. The distance L2 between the gate guard 11 and the end surface (edge 3aa) of the substrate 3 is, for example, in a range of 5 µm to 40 µm, and is 25 µm in one embodiment. The height h1 of the gate guard 11 with respect to the main surface 3a (equal to the thickness of the gate guard 11 in the present embodiment) is, for example, in a range of 2 µm to 8 µm, and is 4 µm in one example.

The drain guard 12 is made of a metal film, fills the openings formed in the insulating films 5 to 8, and is in contact with the second inactive region 4bb of the nitride semiconductor layer 4. The drain guard 12 is provided between the edge 3ab of the main surface 3a on the second inactive region 4bb side and the drain pads 33 so as to be apart from both the edge 3ab and the drain pads 33. In the illustrated example, the drain guard 12 extends mainly along the direction D2 (along the edge 3ab of the main surface 3a). The drain guard 12 includes a portion 12a extending along the side edge 3ac and a portion 12b extending along of the side edge 3ad. These portions 12a and 12b extend from the vicinity of the edge 3ab, and along the side edges 3ac and 3ad in the direction D1, respectively. The drain guard 12 has such a planar shape, and thus surrounds a pad group including the plurality of drain pads 33 from three sides.

The drain guard 12 is in a non-conductive state with respect to the back metal film 45, the gate electrodes 21, the source electrodes 22, and the drain electrodes 23. That is, the drain guard 12 is insulated from the back metal film 45, the gate electrodes 21, the source electrodes 22, and the drain electrodes 23. The drain guard 12 of the present embodiment is connected to the electrodes 21 to 23 and the back metal film 45 via the second inactive region 4bb of the nitride semiconductor layer 4 and the insulating films (dielectric bodies) 5 to 9. During the operation of the transistor 1A, the potential of the drain guard 12 is a value dividing the potential difference between the drain pads 33 and the back metal film 45 in accordance with the ratio of the resistance value between the drain pads 33 and the drain guard 12 and the resistance value between the back metal film 45 and the drain guard 12. Since the distance between the drain pads 33 and the drain guard 12 is shorter than the distance between the back metal film 45 and the drain guard 12, the potential of the drain guard 12 is close to the potential of the drain pads 33.

The contact width between the drain guard 12 and the main surface 3a in the direction intersecting with the extending direction of the drain guard 12 is, for example, in a range of 1 µm to 10 µm, and is 6 µm in one embodiment. The distance between the drain guard 12 and the drain pad 33 on the main surface 3a is, for example, in a range of 5 µm to 20 µm, and is 15 µm in one embodiment. The distance between the drain guard 12 and the end surface (edge 3ab) of the substrate 3 is, for example, in a range of 5 µm to 40 µm, and is 25 µm in one embodiment. The height of the drain guard 12 with respect to the main surface 3a (equal to the thickness of the drain guard 12 in the present embodiment) is, for example, in a range of 2 µm to 8 µm, and is 4 µm in one example.

The gate guard 11 and the drain guard 12 are formed simultaneously with the gate pads 31, the source pad 32, and the drain pads 33, and are made of the same material as these pads 31 to 33. That is, the gate guard 11 and the drain guard 12 of the present embodiment have the same laminated structure as the pads 31 to 33, for example, a laminated structure including a TiW layer and an Au layer on the TiW layer. The gate guard 11 and the drain guard 12 are covered with the insulating film 9.

A method for manufacturing the transistor 1A of the present embodiment having the above structure will be described. FIGS. 5A to 9C are cross-sectional views showing typical steps of the manufacturing method according to the present embodiment. FIGS. 5A, 6A, 7A, 8A, and 9A show cross sections corresponding to the line II-II in FIG. 1. FIGS. 5B, 6B, 7B, 8B, and 9B show cross sections corresponding to the line III-III. FIGS. 5C, 6C, 7C, 8C, and 9C show cross sections corresponding to the line IV-IV.

First, the nitride semiconductor layer 4 is formed on the growth substrate 30, and the substrate 3 is manufactured. Specifically, first, an AlN buffer layer is epitaxially grown on the growth substrate 30, a GaN channel layer is epitaxially grown thereon, an AlGaN (or InAlN) barrier layer is epitaxially grown thereon, and a GaN cap layer is epitaxially grown thereon. Then, the inactive region 4b is formed by ion-implanting Ar$^+$ into a part of the nitride semiconductor layer 4 excluding the active region 4a. Thus, the substrate 3 shown in FIGS. 1 to 4 is manufactured.

Figure 5A:
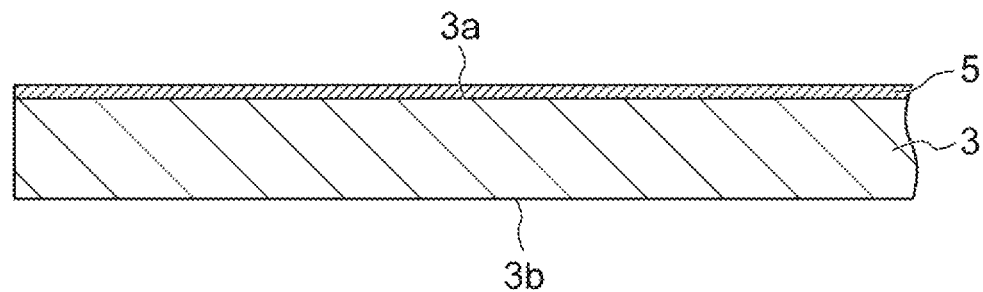
FIG. 5A is a cross-sectional view showing a typical step of a manufacturing method according to the first embodiment, and shows a cross section corresponding to the line II-II in FIG. 1.
Figure 5B:
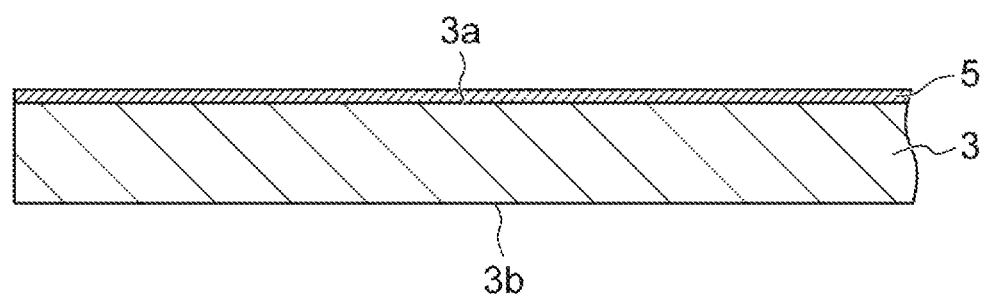
FIG. 5B is a cross-sectional view showing a typical step of the manufacturing method according to the first embodiment, and shows a cross section corresponding to the line III-III in FIG. 1.
Figure 5C:
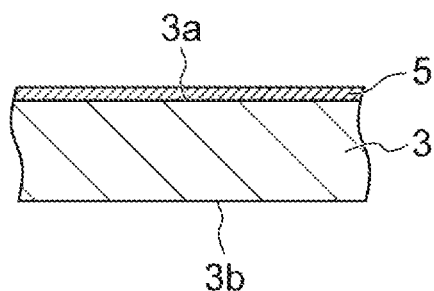
FIG. 5C is a cross-sectional view showing a typical step of the manufacturing method according to the first embodiment, and shows a cross section corresponding to the line IV-IV in FIG. 1.

Next, as shown in FIGS. 5A to 5C, the insulating film 5 is deposited on the main surface 3a of the substrate 3. For example, when the insulating film 5 is made of a silicon compound such as SiN, the insulating film 5 is deposited by a plasma CVD method or a low pressure CVD (LPCVD) method. In the case of LPCVD, the film forming temperature is, for example, 850° C., and the film forming pressure is, for example, 10 Pa or less. The raw materials for forming the film are, for example, NH$_3$ and SiH$_2$Cl$_2$. The thickness of the insulating film 5 is, for example, in a range of 60 nm to 100 nm, and is 60 nm in one embodiment.

Figure 6A:
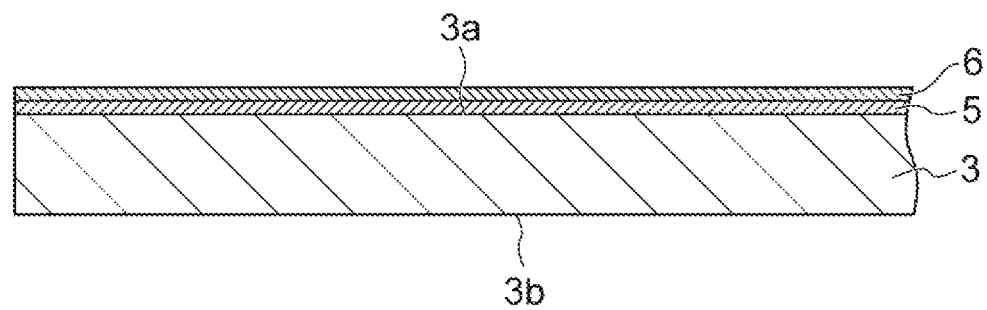
FIG. 6A is a cross-sectional view showing a typical step of the manufacturing method according to the first embodiment, and shows a cross section corresponding to the line II-II in FIG. 1.
Figure 6B:
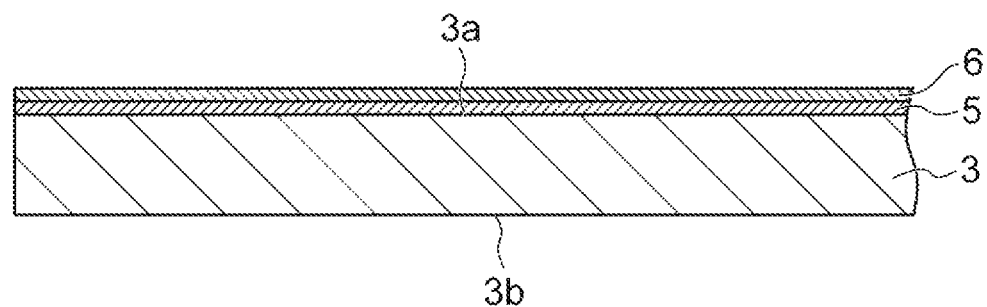
FIG. 6B is a cross-sectional view showing the typical step of the manufacturing method according to the first embodiment, and shows a cross section corresponding to the line III-III in FIG. 1.
Figure 6C:
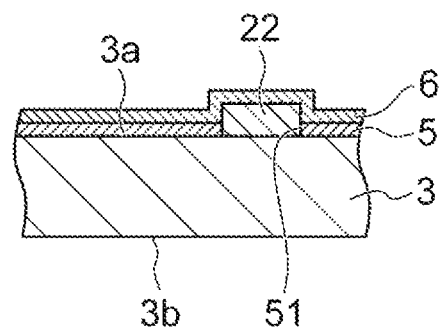
FIG. 6C is a cross-sectional view showing the typical step of the manufacturing method according to the first embodiment, and shows a cross section corresponding to the line IV-IV in FIG. 1.

Subsequently, as shown in FIG. 6C, openings 51 corresponding to the source electrodes 22 are formed in the insulating film 5. At the same time, other openings corresponding to the drain electrodes 23 are formed in the insulating film 5. Specifically, a resist mask having an opening pattern corresponding to these openings are formed on the insulating film 5, and the insulating film 5 is etched through the opening pattern to form these openings. After that, the source electrodes 22 are formed in the openings 51 by using a lift-off method, and the drain electrodes 23 are formed in other openings. That is, with the resist mask left, each metal layer (for example, Ti/Al/Ti, or Ta/Al/Ta) for the source electrodes 22 and the drain electrodes 23 is sequentially deposited using a physical vapor deposition method or the like. The thickness of each Ti layer (or Ta layer) is, for example, in a range of 10 nm to 30 nm (10 nm in one embodiment), and the thickness of the Al layer is, for example, in a range of 200 nm to 400 nm (300 nm in one embodiment). After the metal material deposited on the resist mask is removed together with the resist mask, heat treatment (annealing) is performed at a temperature in a range of 500° C. to 600° C. (550° C. in one embodiment) to alloy the source electrodes 22 and the drain electrode 23. The time for maintaining the temperature in the range of 500° C. to 600° C. is, for example, 1 minute.

Subsequently, as shown in FIGS. 6A to 6C, the insulating film 6 covering the insulating film 5, the source electrodes 22, and the drain electrodes 23 is deposited. For example, when the insulating film 6 is made of a silicon compound such as SiN, the insulating film 6 is deposited by a plasma CVD method. The film forming temperature is, for example, 300° C., and the film forming materials are, for example, NH$_3$ and SiH$_4$. The thickness of the insulating film 6 is, for example, 100 nm. By this step, the region where the gate electrodes 21 are to be formed is covered with the double insulating films 5 and 6.

Figure 7A:
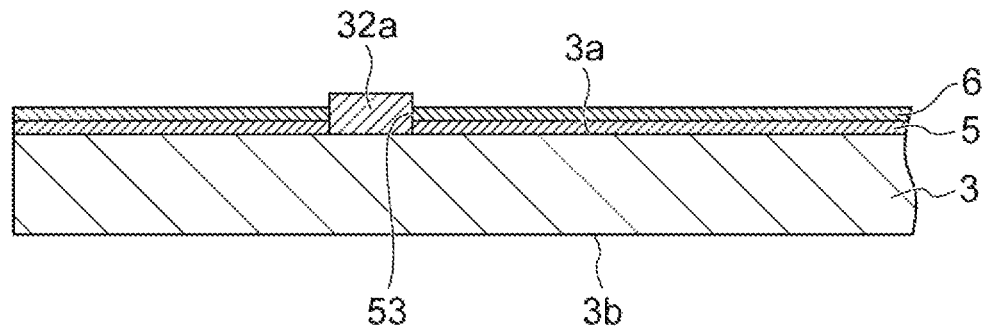
FIG. 7A is a cross-sectional view showing a typical step of the manufacturing method according to the first embodiment, and shows a cross section corresponding to the line II-II in FIG. 1.
Figure 7B:
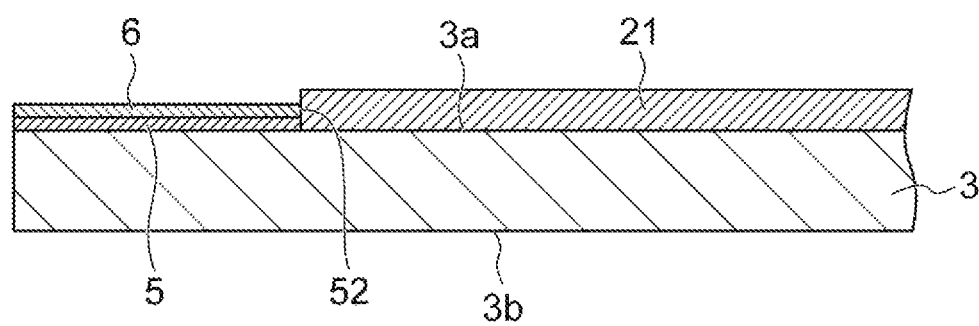
FIG. 7B is a cross-sectional view showing the typical step of the manufacturing method according to the first embodiment, and shows a cross section corresponding to the line III-III in FIG. 1.
Figure 7C:
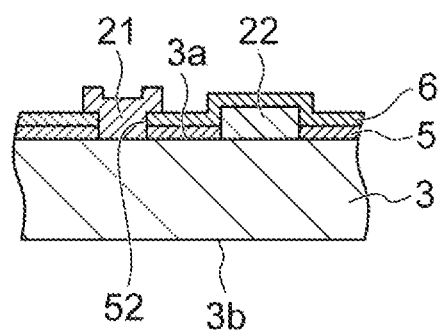
FIG. 7C is a cross-sectional view showing the typical step of the manufacturing method according to the first embodiment, and shows a cross section corresponding to the line IV-IV in FIG. 1.

Subsequently, the lower layers 32a of the source pad 32 and the gate electrodes 21 are formed. First, a resist for an electron beam (EB resist) is deposited on the insulating film 6, and an opening pattern for the gate electrodes 21 and the lower layers 32a of the source pad 32 is formed in the EB resist by EB writing. Next, by continuously etching the insulating film 6 and the insulating film 5 through the opening pattern of the EB resist, openings 52 and 53 penetrating the insulating films 5 and 6 are formed as shown in FIGS. 7B and 7C to expose the nitride semiconductor layer 4. Thereafter, the gate electrodes 21 are formed in the openings 52 and the lower layers 32a of the source pad 32, and at the same time, the lower layers 32a of the source pad 32 are formed in the openings 53 by using the lift-off method. That is, with the EB resist left, each metal layer (for example, Ni/Au or Ni/Pd/Au) for the gate electrodes 21 and the lower layers 32a are sequentially deposited by using a physical vapor deposition method or the like. The thickness of the Ni layer is, for example, in a range of 70 nm to 150 nm (100 nm in one embodiment), the thickness of the Pd layer is, for example, in a range of 50 nm to 100 nm (50 nm in one embodiment), and the thickness of the Au layer is, for example, in a range of 300 nm to 700 nm (500 nm in one embodiment). Thereafter, the metal material deposited on the EB resist is removed together with the EB resist.

Figure 8A:
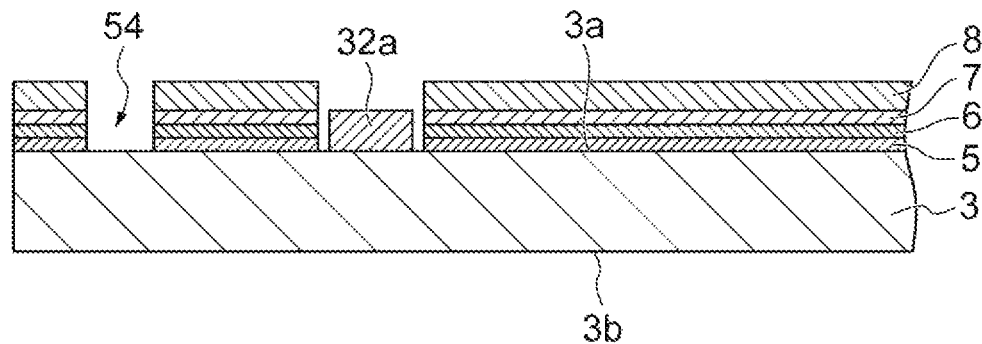
FIG. 8A is a cross-sectional view showing a typical step of the manufacturing method according to the first embodiment, and shows a cross section corresponding to the line II-II in FIG. 1.
Figure 8B:
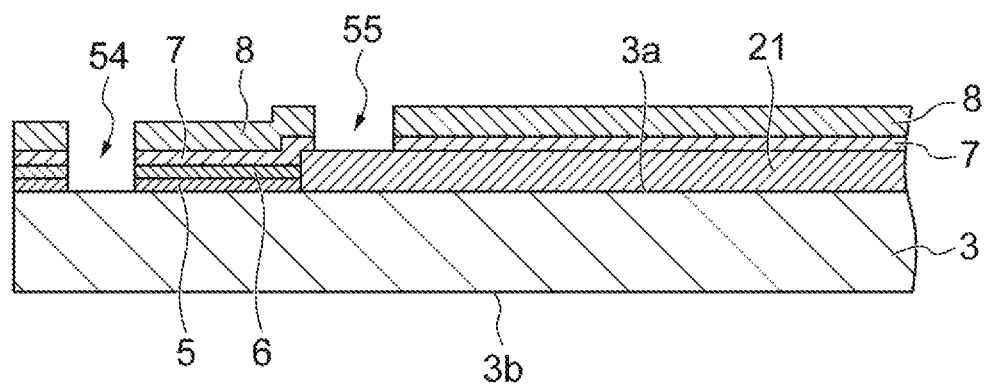
FIG. 8B is a cross-sectional view showing the typical step of the manufacturing method according to the first embodiment, and shows a cross section corresponding to the line III-III in FIG. 1.
Figure 8C:
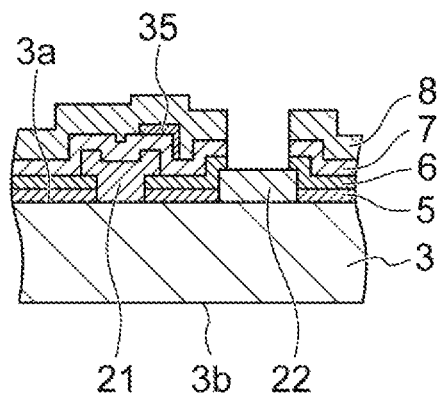
FIG. 8C is a cross-sectional view showing the typical step of the manufacturing method according to the first embodiment, and shows a cross section corresponding to the line IV-IV in FIG. 1.

Subsequently, as shown in FIGS. 8A to 8C, the insulating film 7 is deposited. Initially, the insulating film 7 is formed on the entire surface on the main surface 3a, and covers the insulating film 6, the gate electrodes 21, and the lower layers 32a. For example, when the insulating film 7 is made of a silicon compound such as SiN, the insulating film 7 is deposited by a plasma CVD method. The film forming temperature is, for example, 300° C., and the film forming materials are, for example, NH$_3$ and SiH$_4$. The thickness of the insulating film 7 is, for example, 100 nm.

Subsequently, as shown in FIG. 8C, the field plates 35 are formed on the insulating film 7 along the gate electrodes 21 on the active region 4a. In this step, the field plates 35 are formed using, for example, a lift-off method. That is, a resist mask having an opening pattern corresponding to the planar shapes of the field plates 35 is formed, and each metal layer (for example, Ti (or Ni)/Au) for the field plates 35 is sequentially deposited using a physical vapor deposition method or the like. In one embodiment, the thickness of the Ti layer (or Ni layer) is 10 nm, and the thickness of the Au layer is 200 nm. Thereafter, the metal material deposited on the resist mask is removed together with the resist mask.

Subsequently, an insulating film 8 covering the insulating film 7 and the field plates 35 is deposited. Initially, the insulating film 8 is formed on the entire main surface 3a. For example, when the insulating film 8 is made of a silicon compound such as SiN, the insulating film 8 is deposited by a plasma CVD method. The film forming temperature is, for example, 300° C., and the film forming materials are, for example, NH$_3$ and SiH$_4$. The thickness of the insulating film 8 is, for example, 200 nm to 500 nm.

Subsequently, as shown in FIG. 8A, the insulating films 7 and 8 on the lower layers 32a are removed by etching to form openings, and the lower layers 32a are exposed. At this time, by continuously etching the insulating films 5 to 8 around the lower layers 32a, the nitride semiconductor layer 4 around the lower layers 32a is exposed. At the same time, the insulating films 5 to 8 in regions corresponding to the source pad 32 and the drain pads 33 are removed by etching to form openings. Those openings include regions on the source electrodes 22 and regions on the drain electrodes 23, as shown in FIG. 8C, and in the regions, the source electrodes 22 and the drain electrodes 23 are exposed. Those openings include regions corresponding to the source pad 32 and the drain pads 33 on the inactive region 4b, and in the regions, the nitride semiconductor layer 4 is exposed. At the same time, as shown in FIG. 8B, the insulating films 7 and 8 in the regions corresponding to the gate pads 31 are removed by etching to form openings 55, and the gate electrodes 21 are exposed. Further, in this step, as shown in FIGS. 8A and 8B, the insulating films 5 to 8 in the region corresponding to the gate guard 11 are removed by etching to form an opening 54, and the nitride semiconductor layer 4 is exposed. At the same time, the insulating films 5 to 8 in the region corresponding to the drain guard 12 are removed by etching to form an opening, and the nitride semiconductor layer 4 is exposed. Specifically, a resist mask having an opening pattern corresponding to the above openings is formed on the insulating film 8, and the insulating films 5 to 8 are etched through the opening pattern to form these openings.

Figure 9A:
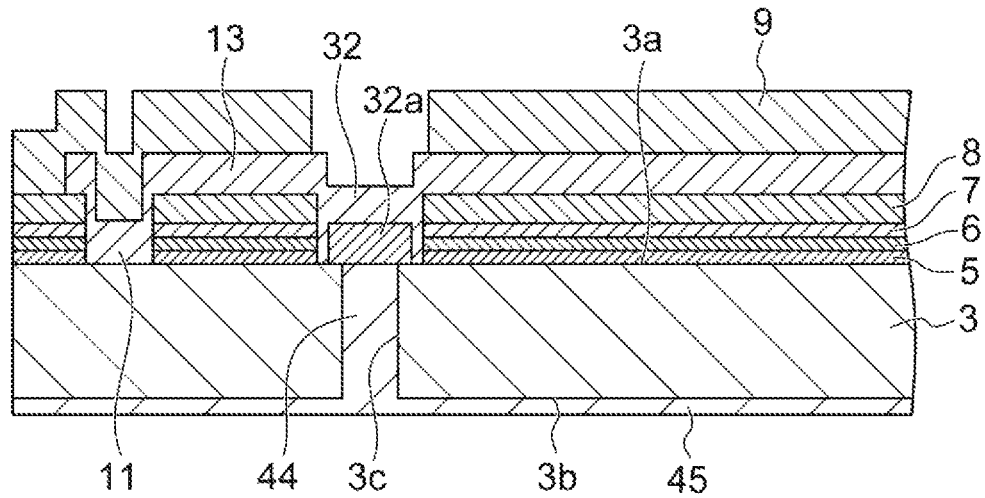
FIG. 9A is a cross-sectional view showing a typical step of the manufacturing method according to the first embodiment, and shows a cross section corresponding to the line II-II in FIG. 1.
Figure 9B:
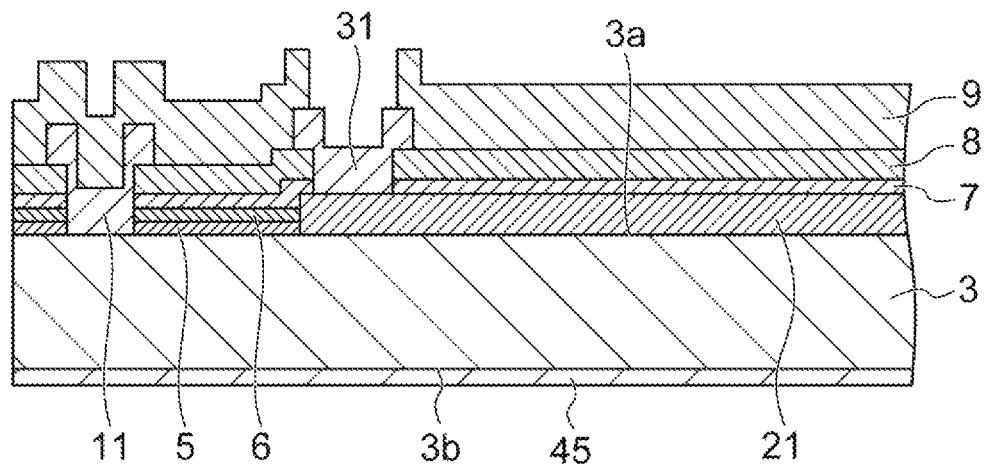
FIG. 9B is a cross-sectional view showing the typical step of the manufacturing method according to the first embodiment, and shows a cross section corresponding to the line III-III in FIG. 1.
Figure 9C:
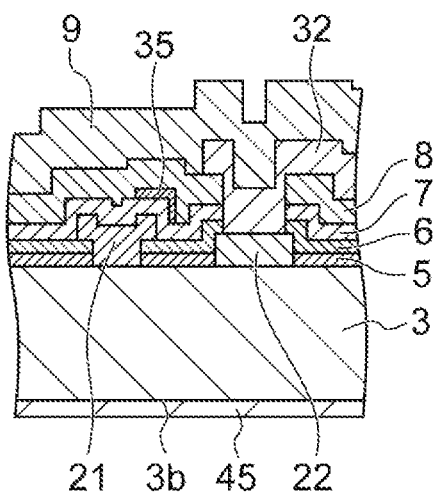
FIG. 9C is a cross-sectional view showing the typical step of the manufacturing method according to the first embodiment, and shows a cross section corresponding to the line IV-IV in FIG. 1.

After the resist mask is removed, as shown in FIGS. 9A to 9C, the gate guard 11, the drain guard 12, the wires 13, the gate pads 31, the source pad 32, and the drain pads 33 are simultaneously formed. Specifically, a seed metal layer (Ti/TiW/Ti/Au) is formed on the entire main surface 3a by a sputtering method. The thickness of each Ti layer is, for example, 10 nm, the thickness of the TiW layer is, for example, 100 nm, and the thickness of the Au layer is, for example, 100 nm. Then, a resist mask having openings in regions where the gate guard 11, the drain guard 12, the wires 13, the gate pads 31, the source pad 32, and the drain pads 33 are to be formed is formed on the seed metal layer. Thereafter, an electrolytic plating process is performed to form an Au layer in each opening of the resist mask. At this time, the thickness of the Au layer is, for example, 3 μm. After the plating process, the resist mask is removed, and the exposed seed metal layer is removed.

Subsequently, an insulating film (passivation film) 9 is deposited on the entire surface on the main surface 3a. For example, when the insulating film 9 is made of a silicon compound such as SiN, the insulating film 9 is deposited by a plasma CVD method. The film forming temperature is, for example, 300° C., and the film forming materials are, for example, $NH_3$ and $SiH_4$. The thickness of the insulating film 9 is, for example, 200 nm to 500 nm. After that, openings of the insulating film 9 are formed on the gate pads 31, the source pad 32, and the drain pads 33 in the inactive region 4b to expose the gate pads 31, the source pad 32, and the drain pads 33, respectively. Thus, the process on the main surface 3a side is completed.

Subsequently, a protective resist is formed on the main surface 3a by spin coating, and the resist covers all components on the main surface 3a. Then, a support substrate is attached to the resist. The support substrate is, for example, a glass plate. Then, the back surface 3b of the substrate 3 is polished to thin the substrate 3. At this time, for example, the growth substrate 30 having a thickness of 500 μm is thinned to 100 μm.

Subsequently, a seed metal film (for example, TiW/Au) is formed on the back surface 3b and the side surfaces of the substrate 3 by, for example, a sputtering method. After a resist pattern is formed at positions overlapped with the lower layers 32a of the source pad 32, a Ni mask is formed by performing a Ni plating process. After that, the resist pattern is removed, and the exposed seed metal film is removed by etching. Thereby, the regions of the back surface 3b overlapped with the lower layers 32a are exposed through the openings of the Ni mask. When the seed metal film is made of TiW/Au, the seed metal film can be easily removed by reactive ion etching (RIE) using a fluorine-based gas.

Subsequently, the through holes 3c (see FIG. 2) are formed in the substrate 3 by etching the growth substrate 30 and the nitride semiconductor layer 4 through the openings of the Ni mask. The through holes 3c reach the lower layers 32a from the back surface 3b of the substrate 3. Thereby, the lower layers 32a are exposed to the back surface 3b through the through holes 3c. Then, a seed metal film (for example, TiW/Au) is formed on the back surface 3b of the substrate 3 and on the inner surfaces of the through holes 3c (including on the exposed lower layers 32a) by, for example, a sputtering method. By performing plating on the seed metal film, the back metal film 45 is formed on the back surface 3b, and the metal vias 44 reaching the lower layers 32a from the back surface 3b are formed in the through holes 3c. Finally, the components on the main surface 3a side of the substrate 3 are separated from the support substrate. After the substrate products including the substrate 3 taken out are cleaned, dicing is performed along scribe lines to separate individual chips from each other. Through the above steps, the transistor 1A of the present embodiment is completed.

An effect obtained by the transistor 1A of the present embodiment described above will be described together with a conventional problem. Usually, the back metal film 45 is conductively bonded to a metal base member via a conductive bonding material. In many cases, the base member is set to a reference potential (ground potential). In this case, when a negative voltage lower than the reference potential is applied to the gate electrodes 21, an electric field with the gate pads 31 side being negative is generated between the gate pads 31 and the base member. In a humid environment, ion migration of a metal (for example, Ag, Au, Cu) contained in the conductive bonding material is likely to occur due to this electric field. The Ion migration is a phenomenon in which ionized metal moves on the surface of a substance between electric fields. The metal ions move by being attracted by the electric field, return to the metal from the ionized state for some reason, and accumulate to form dendrites. If the dendrites of metal grow from the conductive bonding material and the gate pads 31 and the back metal film 45 are short-circuited, the operation of the transistor may be defective.

In recent years, wide-gap semiconductor devices using GaN, SiC, $Ga_2O_3$, and the like as main semiconductor materials have been actively developed and are being put into practical use. Since wide-gap semiconductor devices have a high withstand voltage, the performance of the semiconductor is enhanced by increasing the power supply voltage to increase the mobility. reducing the parasitic capacitance between the electrodes, and the like. For this reason, in a wide-gap semiconductor device, the above-mentioned electric field becomes strong, and ion migration easily occurs.

Therefore, the transistor 1A of the present embodiment includes the gate guard 11 between the edge 3aa of the main surface 3a and the gate pads 31. The gate guard 11 is electrically connected to the back metal film 45 and is defined at the same potential (for example, a reference potential) as the back metal film 45. As a result, an electric field is mainly generated between the gate guard 11 and the gate pads 31, and an electric field generated between the gate guard 11 and the back metal film 45 is small. Therefore, since the force for moving metal ions between the gate guard 11 and the back metal film 45 is extremely weak, the growth of dendrites on the side surfaces of the substrate 3 can be suppressed, and the short circuit between the back metal film 45 and the gate pads 31 can be reduced.

The transistor 1A of the present embodiment includes the drain guard 12 between the edge 3*ab* of the main surface 3*a* and the drain pads 33. Thus, the entry of moisture into the active region 4*a* can be suppressed together with the gate guard 11, and the moisture resistance of the transistor 1A can be improved. Here, if the drain guard 12 is electrically connected to the gate guard 11 with a low resistance, the following problem occurs. Usually, a positive bias voltage is applied to the drain electrodes 23. In the case of a transistor using GaN as a main semiconductor material, the bias voltage to the drain electrodes 23 is a high voltage exceeding, for example, 50V. When the drain guard 12 is electrically connected to the gate guard 11, the drain guard 12 is defined at the same potential (for example, a reference potential) as the back metal film 45. Since the drain guard 12 is arranged close to the drain pads 33, the electric field between the drain guard 12 and the drain pads 33 increases. The surfaces of the drain pads 33 are exposed from the openings of the insulating film 9, and moisture enters the boundary between the insulating film 9 and the drain pads 33. The electric field accelerates the entry of moisture between the drain guard 12 and the drain pads 33. Therefore, the moisture resistance of the transistor 1A is decreased.

To solve this problem, in the present embodiment, the drain guard 12 is in a non-conductive state with respect to the back metal film 45, the gate electrodes 21, the source electrodes 22, and the drain electrodes 23. In this case, the electric field between the drain guard 12 and the drain pads 33 can be reduced as compared with the case where the drain guard 12 is electrically connected to the gate guard 11 with low resistance. Therefore, the decrease in the moisture resistance of the transistor 1A can be suppressed.

As in the present embodiment, the source pad 32 may be arranged side by side with the gate pads 31 on the first inactive region 4*ba*, and the gate guard 11 may extend from the source pad 32 along the edge 3*aa* on the first inactive region 4*ba* side. For example, with such a configuration, the gate guard 11 can be electrically connected to the source electrodes 22, and the gate guard 11 can be arranged between the gate pads 31 and the edge 3*aa*.

As in the present embodiment, the gate guard 11 and the drain guard 12 may be covered with the insulating film 9 having openings on the drain pads 33 and the gate pads 31. In this case, the moisture resistance of the transistor 1A can be further improved.

(Modification)

Figure 10:
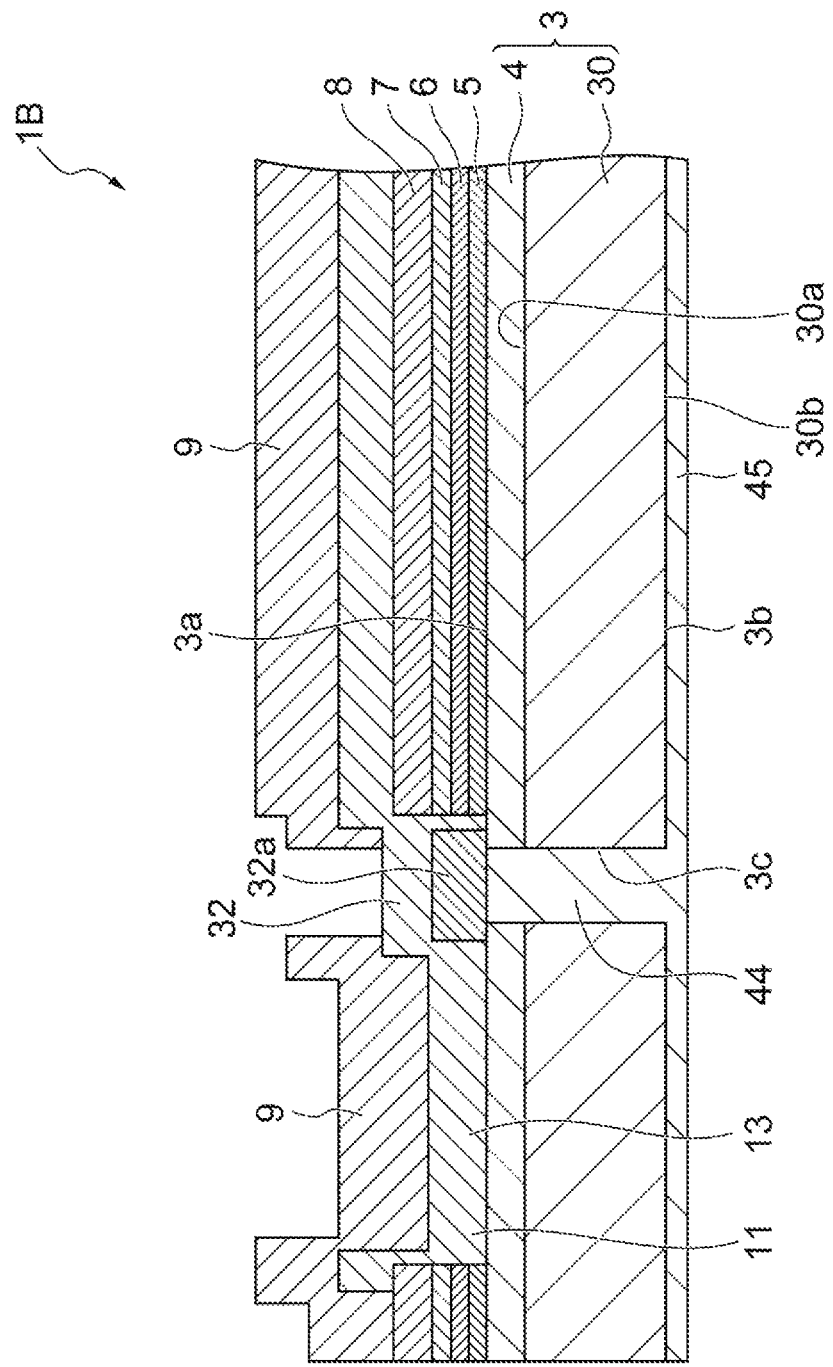
FIG. 10 is a partial cross-sectional view of a transistor according to a modification, and shows a cross section corresponding to the line II-II shown in FIG. 1.

FIG. 10 is a partial cross-sectional view of a transistor 1B according to a modification of the above embodiment, and shows a cross section corresponding to the line II-II shown in FIG. 1. In the present modification, unlike the above embodiment, the insulating films 5 to 8 are not interposed between the wires 13 connecting the gate guard 11 and the source pad 32 and the nitride semiconductor layer 4, and the wires 13 and the nitride semiconductor layer 4 are in contact with each other. That is, the wires 13 of the present modification are formed directly on the exposed nitride semiconductor layer 4. In this case, the wires 13 each function as a part of the gate guard 11, and the effect of the above embodiment can be made more remarkable.

Second Embodiment

Figure 11:
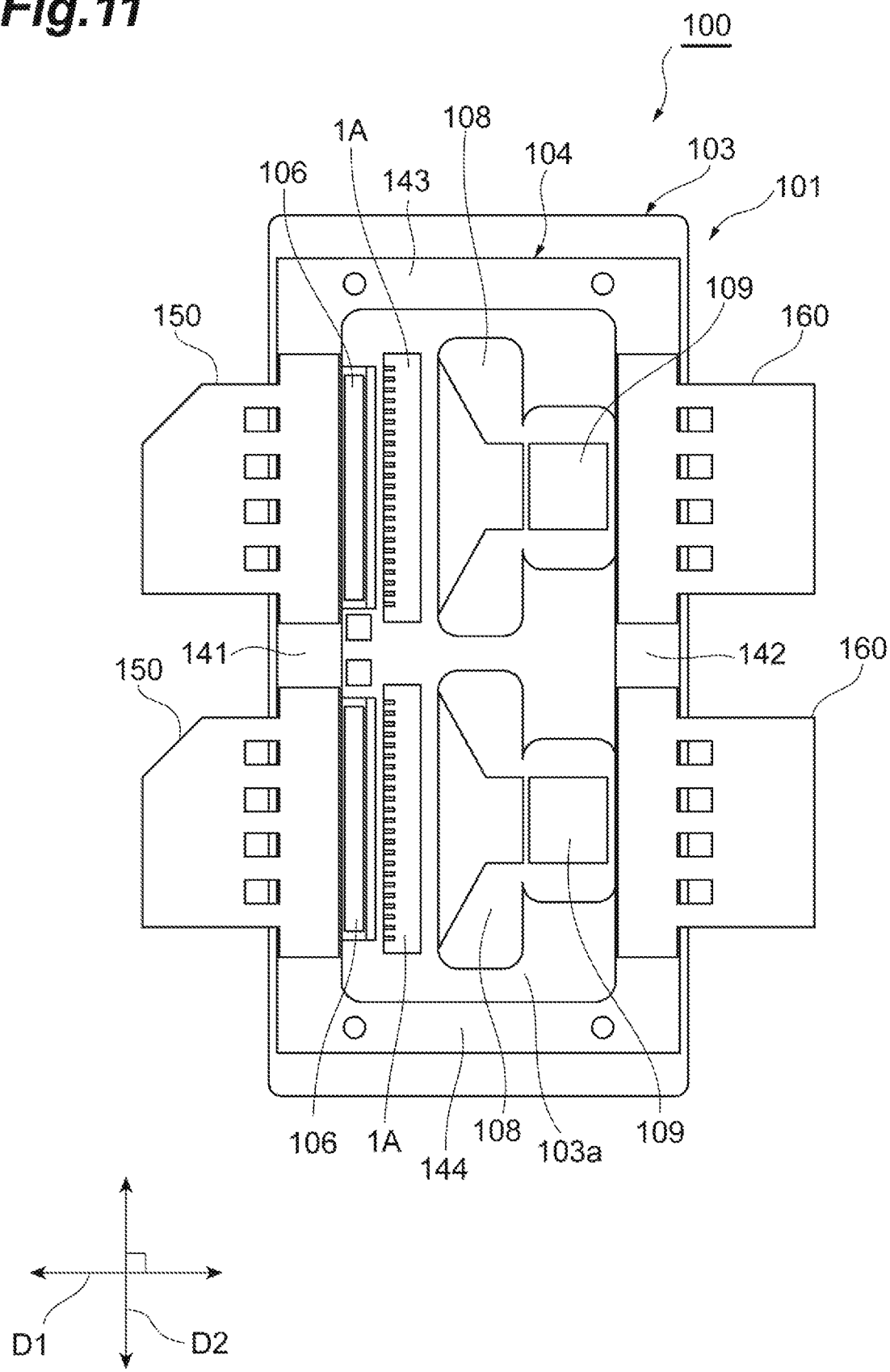
FIG. 11 is a plan view showing a configuration of a semiconductor device according to the second embodiment.

FIG. 11 is a plan view showing a configuration of a semiconductor device 100 according to the second embodiment. FIG. 11 shows a state where a lid of the semiconductor device 100 is removed. The semiconductor device 100 includes the transistors 1A of the first embodiment, a package 101, input matching circuits 106, output matching circuits 108, and output capacitors 109. The transistors 1A, the input matching circuits 106, the output matching circuits 108, and the output capacitors 109 are housed in the package 101. The package 101 has a non-hermetic structure in which hermetic sealing is not performed.

The package 101 includes a base member 103, a side wall 104, two input leads 150, and two output leads 160. The base member 103 is a plate-shaped member including a flat main surface 103*a* made of metal. The base member 103 is made of, for example, copper, an alloy of copper and molybdenum, an alloy of copper and tungsten, or a laminated material of a copper plate, a molybdenum plate, a tungsten plate, an alloy plate of copper and molybdenum, and an alloy plate of copper and tungsten. The surface of the base material of the base member 103 is plated with nickel chrome (nichrome)-gold, nickel-gold, nickel-palladium-gold, silver or nickel, or nickel-palladium. Gold, silver, and palladium are plating materials, and NiCr and Ni are seed materials. Adhesion can be enhanced when the plating material and the seed material are included, as compared with the case where only the plating material is used. The thickness of the base member 103 is, for example, 0.5 mm to 1.5 mm. The planar shape of the base member 103 is, for example, a rectangular shape.

The side wall 104 is a substantially rectangular frame-shaped member made of ceramic as a dielectric body. The side wall 104 includes a pair of portions 141 and 142 facing each other in the direction D1 along the main surface 103*a* of the base member 103, and a pair of portions 143 and 144 facing each other in the direction D2 crossing the direction D1. The portions 141 and 142 extend parallel to each other along the direction D2, and the portions 143 and 144 extend parallel to each other along the direction D1. The cross section of each of the portions 141 to 144 perpendicular to the extending direction is rectangular or square. The height of the side wall 104 in the normal direction of the main surface 103*a* is, for example, 0.5 mm to 1.0 mm. The side wall 104 is coupled with the main surface 103*a* of the base member 103 via an adhesive material such as a silver braze.

The input lead 150 and the output lead 160 are metal plate-shaped members, and in one example, are metal sheets of copper, copper alloy, or iron alloy. The input lead 150 has one end in the direction D1 coupled with the upper surface of the portion 141 of the side wall 104. The input lead 150 is insulated from the main surface 103*a* of the base member 103 by the portion 141 of the side wall 104. The output lead 160 has one end in the direction D1 coupled with the upper surface of the portion 142 of the side wall 104. The output lead 160 is insulated from the main surface 103*a* of the base member 103 by the portion 142 of the side wall 104.

The transistors 1A, the input matching circuits 106, the output matching circuits 108, and the output capacitors 109 are mounted on a region surrounded by the side wall 104 on the main surface 3*a* of the base member 103. The input matching circuits 106, the transistors 1A, the output matching circuits 108, and the output capacitors 109 are provided in this order from the portion 141 of the side wall 104. The input matching circuits 106 and the output matching circuits 108 are, for example, parallel plate type capacitors each having electrodes on the upper and lower surfaces of a ceramic substrate.

The input matching circuits 106, the transistors 1A, and the output matching circuits 108 are fixed on the base member 103 with a conductive bonding material such as a sintered-type conductive paste. The conductive bonding material includes at least one of Ag, Au, and Cu. In one embodiment, the conductive bonding material is obtained by sintering a sintered-type Ag paste. The conductive bonding material for fixing the transistor 1A is interposed between the back metal film 45 of the transistor 1A and the main surface 103a of the base member 103, and electrically connects and strongly connects them. The input matching circuits 106 are mounted on the input side of the transistors 1A, and the output matching circuits 108 are mounted on the output side of the transistors 1A, respectively. the input matching circuits 106 and the transistors 1A, the transistors 1A and the output matching circuits 108, the output matching circuits 108 and the output capacitors 109, and the output capacitors 109 and the output leads 160 are electrically connected with corresponding wires (not shown).

The input matching circuits 106 perform impedance matching between the input leads 150 and the transistors 1A. One ends of the input matching circuits 106 are electrically connected to the input leads 150 via bonding wires. The other ends of the input matching circuits 106 are electrically connected to the gate pads 31 (see FIG. 1) of the transistors 1A via bonding wires.

The output matching circuits 108 perform impedance matching between the transistors 1A and an external circuit. The output matching circuits 108 perform matching so that desired output, efficiency, and frequency characteristics are obtained. One ends of the output matching circuits 108 are electrically connected to the drain pads 33 (see FIG. 1) of the transistors 1A via bonding wires. The other ends of the output matching circuits 108 are electrically connected to the output leads 160 via bonding wired and the output capacitors 109.

The semiconductor device 100 of the present embodiment includes the transistor 1A of the first embodiment. Therefore, the growth of dendrites due to ion migration of the conductive bonding material interposed between the transistor 1A and the main surface 103a of the base member 103 can be suppressed, and the short circuit between the main surface 103a of the base member 103 and the gate pads 31 can be reduced. The entry of moisture into the active region 4a can be suppressed, and the moisture resistance of the transistor 1A can be improved. When the package 101 that houses the transistor 1A has a non-hermetic structure as in the present embodiment, the usefulness of the transistor 1A becomes more remarkable.

The field effect transistor and the semiconductor device according to the present disclosure are not limited to the above-described embodiments, and various other modifications may be made thereto. For example, in the above embodiments, the metal vias 44 are provided immediately below the source pad 32 in the inactive region 4b, but may be provided immediately below the source electrodes 22 in the active region 4a (or immediately below the openings formed in the source electrodes 22). In the above embodiments, the gate guard 11 includes the portions 11a and 11b, and the drain guard 12 includes the portions 12a and 12b, but at least one of these portions may be omitted as necessary. In the above embodiments, the gate guard 11, the drain guard 12, and the source pad 32 have the same configuration and are formed at the same time. However, they may have different configurations and may be formed at different timings.

What is claimed is:

1. A field effect transistor comprising:
   a substrate including a main surface and a back surface;
   a semiconductor region on the main surface, the semiconductor region including a first inactive region, an active region, and a second inactive region arranged side by side in a direction;
   a gate electrode, a source electrode, and a drain electrode on the active region;
   a gate pad on the first inactive region and electrically connected to the gate electrode;
   a gate guard on and in contact with the semiconductor region, the gate guard being apart from the gate pad and located between the gate pad and an edge on the first inactive region side of a pair of edges of the semiconductor region arranged side by side in the direction;
   a drain pad on the second inactive region and electrically connected to the drain electrode;
   a drain guard on and in contact with the semiconductor region, the drain guard being apart from the drain pad and located between the drain pad and an edge on the second inactive region side of the pair of edges of the semiconductor region; and
   a metal film on the back surface and electrically connected to the gate guard,
   wherein the drain guard is in a non-conductive state with respect to the metal film, the gate electrode, the source electrode and the drain electrode.

2. The field effect transistor according to claim 1, further comprising a wire penetrating the substrate and the semiconductor region,
   wherein the source electrode is electrically connected to the metal film via the wire, and
   wherein the gate guard is electrically connected to the source electrode.

3. The field effect transistor according to claim 1, further comprising a source pad electrically connected to the source electrode, the source pad being arranged on the first inactive region side by side with the gate pad, and
   wherein the gate guard is extended from the source pad along the edge on the first inactive region side.

4. The field effect transistor according to claim 1, further comprising an insulating film having openings on the drain pad and the gate pad,
   wherein the gate guard and the drain guard are covered with the insulating film.

5. The field effect transistor according to claim 1, wherein the gate guard is made of metal.

6. The field effect transistor according to claim 1, wherein the drain guard is made of metal.

7. A semiconductor device comprising:
   the field effect transistor according to claim 1;
   a base member having a metal surface and mounting the field effect transistor; and
   a conductive bonding material interposed between the metal film of the field effect transistor and a surface of the base member, the conductive bonding material including at least one of Ag, Au, and Cu.

8. The semiconductor device according to claim 7, further comprising a package where the field effect transistor is non-hermetically housed.

9. A field effect transistor comprising:
   a substrate including a main surface and a back surface;

a semiconductor region on the main surface, the semiconductor region including a first edge, a first inactive region, an active region, a second inactive region and a second edge arranged side by side in a direction;
a gate electrode, a source electrode, and a drain electrode on the active region;
a gate pad on the first inactive region and electrically connected to the gate electrode;
a gate guard on and in contact with the semiconductor region, the gate guard being apart from the gate pad and being located between the first edge and the gate pad;
a drain pad on the second inactive region and electrically connected to the drain electrode;
a drain guard on and in contact with the semiconductor region, the drain guard being apart from the drain pad and being located between the second edge and the drain pad; and
a metal film on the back surface and electrically connected to the gate guard,
wherein the drain guard is electrically insulated from the metal film, the gate electrode, the source electrode and the drain electrode.

10. The field effect transistor according to claim 9, further comprising a wire embedded in the substrate and the semiconductor region,
wherein the source electrode is electrically connected to the metal film via the wire, and
wherein the gate guard is electrically connected to the source electrode.

11. The field effect transistor according to claim 9, further comprising a source pad electrically connected to the source electrode, the source pad being arranged on the first inactive region side by side with the gate pad, and
wherein the gate guard is extended from the source pad along the first edge in a plan view.

12. The field effect transistor according to claim 9, further comprising an insulating film having a first opening on the drain pad and a second opening on the gate pad,
wherein the gate guard and the drain guard are covered with the insulating film.

13. The field effect transistor according to claim 9, wherein the gate guard is made of metal.

14. The field effect transistor according to claim 9, wherein the drain guard is made of metal.

* * * * *